United States Patent [19]

Goodwin et al.

[11] 4,226,648
[45] Oct. 7, 1980

[54] METHOD OF MAKING A HYPERABRUPT VARACTOR DIODE UTILIZING MOLECULAR BEAM EPITAXY

[75] Inventors: Charles A. Goodwin, Wyomissing; Yusuke Ota, Slatington, both of Pa.

[73] Assignee: Bell Telephone Laboratories, Incorporated, Murray Hill, N.J.

[21] Appl. No.: 21,226

[22] Filed: Mar. 16, 1979

[51] Int. Cl.³ .................. H01L 21/203; H01L 21/22
[52] U.S. Cl. ................................ 148/175; 29/576 E; 148/1.5; 148/187; 357/13; 357/14; 357/58; 357/89; 357/90
[58] Field of Search .................. 148/1.5, 175, 187; 29/576 E; 357/13, 14, 58, 89, 90

[56] References Cited

U.S. PATENT DOCUMENTS

| | | | |
|---|---|---|---|
| 3,201,664 | 8/1965 | Adam | 148/175 X |
| 3,208,887 | 9/1965 | Anderson | 357/89 X |
| 3,312,880 | 4/1967 | Longo et al. | 357/90 X |
| 3,383,571 | 5/1968 | Turner et al. | 148/175 X |
| 3,411,053 | 11/1968 | Wiesner | 357/14 |
| 3,483,441 | 12/1969 | Hofflinger | 148/175 X |
| 3,634,738 | 1/1972 | Leith et al. | 357/14 |
| 3,638,300 | 2/1972 | Foxhall et al. | 357/14 X |
| 3,764,415 | 10/1973 | Raabe et al. | 148/187 X |
| 3,860,945 | 1/1975 | Dawson | 357/14 |
| 4,106,953 | 8/1978 | Onodera | 357/14 X |

OTHER PUBLICATIONS

Weisberg, L. R., "Low Temperature Vacuum Deposition . . . Silicon," J. Appl. Physics, vol. 38, 1967, pp. 4537–4538.

Itoh et al., "Epitaxial Films of Silicon . . . Vacuum Evaporation," J. Applied Physics, vol. 40, No. 6, May 1969, pp. 2597–2600.

Booker et al., "Growth of Epitaxial Silicon by Vacuum Evaporation," Philosophical Mag., Series 8, vol. 11, Jan. 1965, pp. 11–30.

Ota, Y., "Si Molecular Beam Epitaxy . . . Doping Control," J. Electrochem. Soc., vol. 124, No. 11, Nov. 1977, pp. 1795–1802.

Primary Examiner—L. Dewayne Rutledge
Assistant Examiner—W. G. Saba
Attorney, Agent, or Firm—H. W. Lockhart

[57] ABSTRACT

A semiconductor varactor diode of the hyperabrupt junction type, typically having a PNN+ configuration, is disclosed. The impurity concentration in the intermediate N-type portion is grown in by the molecular beam epitaxy process to provide the hyperabrupt profile. Also, the N-type background doping in the P-type zone is minimized by the same epitaxial process to reduce the level of impurity compensation needed.

4 Claims, 3 Drawing Figures

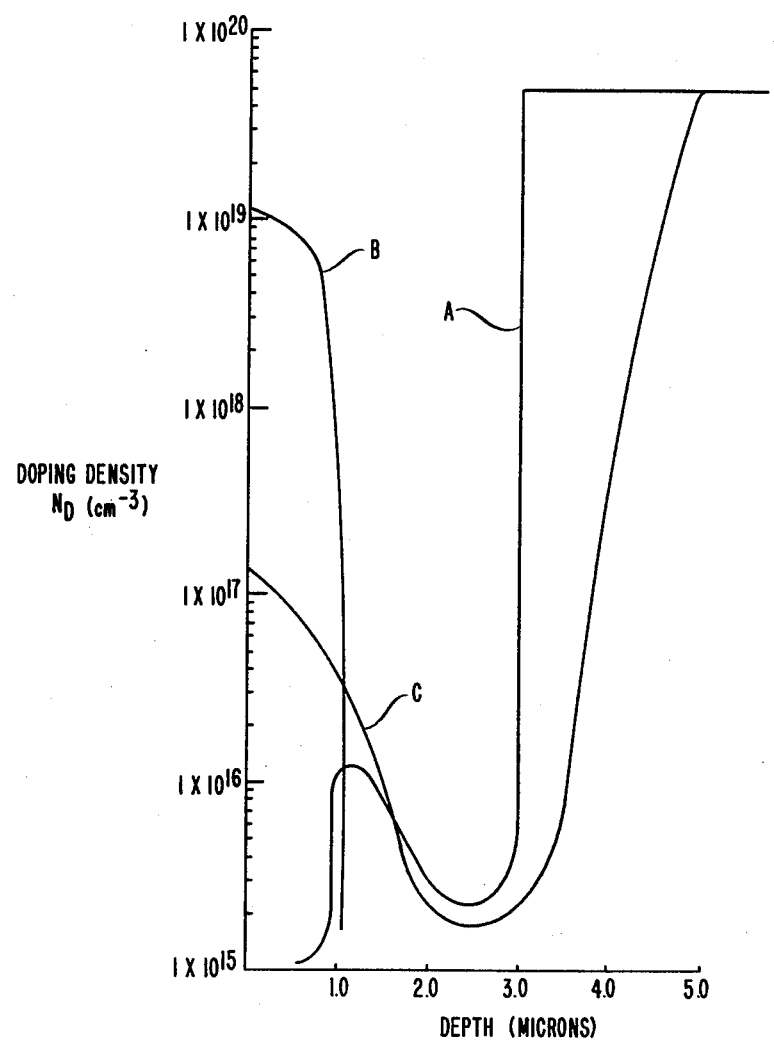

METHOD OF MAKING A HYPERABRUPT VARACTOR DIODE UTILIZING MOLECULAR BEAM EPITAXY

BACKGROUND OF THE INVENTION

This invention relates to semiconductor diodes of the type known as varactors and more particularly to varactor diodes characterized by hyperabrupt PN junctions which exhibit very sharp C-V characteristics.

Hyperabrupt junction diodes are devices which are characterized by a rapid change in the depletion layer capacitance with reverse voltage. This is obtained, generally, by arranging the significant impurity on one side of the PN junction, usually the N-type to have a sharply decreasing concentration with distance away from the PN junction. Thus, there is enabled a rapid decrease in capacitance with reverse voltage because of the more rapid expansion of the depletion layer as compared to the response of linear graded and abrupt step junction diodes.

The disclosure of U.S. Pat. No. 3,638,300 to G. F. Foxhall and R. A. Moline describes a technique for fabricating a high performance hyperabrupt diode by ion implantation and diffusion of selected impurities into a relatively lightly doped epitaxial layer grown on a starting portion of monocrystalline silicon semiconductor material which is heavily doped to provide high conductivity.

Characteristics of particular importance with respect to hyperabrupt diodes used at microwave frequencies are the breakdown voltage and the rf series resistance. The first is, to some extent, a function of the total doping level particularly in the N-type portion near the PN junction. The implanted-diffused device, in which the significant dopants all are introduced from the epitaxial surface tends to have relatively high doping levels in this zone.

The series resistance is increased, disadvantageously, in a device having a thicker epitaxial layer and with more undepleted high resistivity silicon in the epitaxial portion between the PN junction and the epitaxial layer interface with the starting portion. The diode of the prior art which is produced by a process requiring relatively high temperatures for an appreciable time, tends to require a thicker epitaxial layer and as a result will have a thicker undepleted, high resistivity portion to allow for out-diffusion from the starting portion.

Accordingly, an object of this invention is a hyperabrupt diode in which the above-described problems are reduced.

SUMMARY OF THE INVENTION

In accordance with an embodiment of the invention, a hyperabrupt diode comprises a monocrystalline silicon semiconductor body having a low resistivity starting portion of one conductivity type and an adjoining layer formed by epitaxial deposition which includes the hyperabrupt PN junction. The invention is characterized first by the fact that the portion of the epitaxial layer containing the hyperabrupt impurity concentration profile which adjoins and is of the same conductivity type as the starting portion is formed by the molecular beam epitaxy (MBE) process. Second, the surface adjoining portion of the epitaxial layer likewise is formed by the MBE process which enables an extremely low impurity concentration which then readily accepts introduction of an opposite conductivity type impurity to form the PN junction with minimal compensation doping therein.

As is known, the hyperabrupt concentration profile is one in which impurity concentration decreases abruptly with distance away from the PN junction. In accordance with this invention, this hyperabrupt profile portion, as well as the extremely low doped surface-adjoining portion are formed at relatively low temperature and, as a consequence, a minimum of impurity diffusion occurs out of the starting portion into the epitaxial portion during the epitaxial process. In the absence of such outdiffusion, the epitaxial layer may be thinner and there will be less undepleted high resistivity material therein, thereby enabling smaller rf series resistance.

Also importantly, the surface-adjoining portion of the epitaxial layer, being initially very lightly doped is converted to the opposite conductivity type without producing a heavily compensated region in this portion. In prior art practice where both the hyperabrupt profile impurity and the opposite type impurity in the surface adjoining portion are introduced from the surface, the consequent heavily compensated region is disadvantageous in its effect on breakdown voltage and on control of the PN junction depth.

Accordingly, hyperabrupt diodes in accordance with this invention may have lower rf series resistance than those previously available.

One feature of a planar hyperabrupt diode in accordance with the invention is a less heavily doped surface region enabling higher breakdown voltages than in prior art devices.

BRIEF DESCRIPTION OF THE DRAWING

The invention and its objects and other features will be more clearly understood from the following detailed description taken in conjunction with the drawing in which:

FIGS. 2 and 3 are graphs of impurity concentration vs. depth from the device surface for hyperabrupt diodes.

DETAILED DESCRIPTION

The feasibility of the molecular beam epitaxy technique for the deposition of single crystal silicon is known and has been described in the paper by Y. Ota, *J. Electrochem. Soc.* Vol. 124, p. 1795 (1977). The silicon molecular beam epitaxy process is significant to this invention wherein it is used to form an epitaxial layer having a particular impurity concentration profile which has a peak value near the desired Pn junction depth for the diode. The particular advantages of this process, namely, low temperature and precise doping control which are significant to this invention, will become apparent from the following description. In particular, molecular beam epitaxy is done at temperatures in the range of from about 450 degrees to about 950 degrees C., at which solid state diffusion occurs at relatively low rates.

In the above-noted publication the silicon material formed by molecular beam epitaxy is doped by the addition of antimony by evaporation. In an alternative embodiment an ion gun system is used to add a doping impurity. Such a system is particularly useful for an impurity such as arsenic whose high vapor pressure makes it unsuitable for the evaporation technique. However, the ion implantation method gives excellent control for a number of impurities including boron and phosphorus as well.

In addition to the standard growth chamber and molecular beam silicon apparatus the ion implantation doping system contains a miniature ion gun system to create the As+ ions, which then are selected by an E×B filter. There is then a beam drift section consisting of 15 degrees deflection plates to eliminate neutral particles and horizontal and vertical scanning plates to position and scan the As+ beam. This section also contains an ion beam detector to monitor the As+ ion beam density during growth of the epitaxial film. The three sections, ion gun, drift chamber and growth chamber are independently pumped and connected together through small holes to permit differential pumping. During film growth, the vacuum in the growth chamber, typically, is in the range of $10^{3 1-9}$ Torr.

Figure 1:
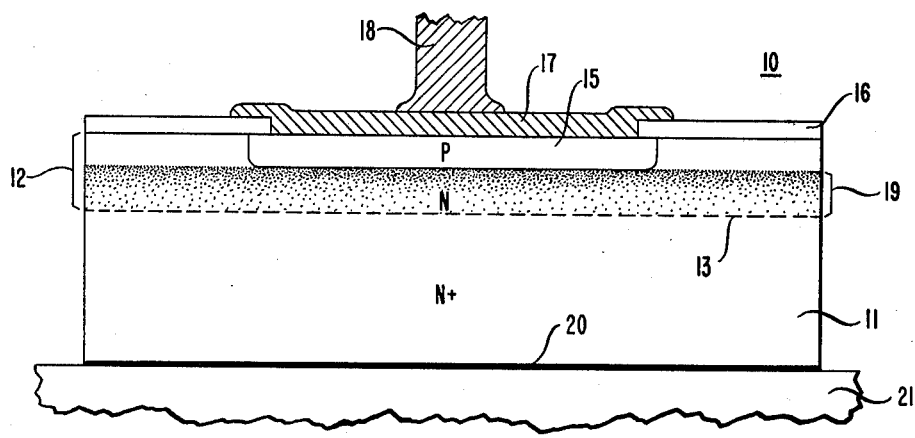
FIG. 1 is a side view taken in cross section of a hyperabrupt semiconductor diode in accordance with this invention.

FIG. 1 shows the general configuration of a semiconductor diode of the epitaxial type. The device 10 comprises a starting single crystal portion 11 of silicon and an epitaxial layer 12 defined therefrom by the interface 13. The starting portion 11 is of low resistivity N-type silicon having a uniform arsenic impurity concentration of about $5 \times 10^{19}$ atoms per cubic centimeter. The epitaxial layer 12, formed by molecular beam epitaxy is of N-type conductivity and has an N-type impurity concentration which increases as the thickness of the layer increases to the level indicated by the top of the stippled layer 19. The density of the stippling is generally indicative of the level of the impurity concentration. At this level of epitaxial growth the N-type doping impurity is cut off and the additional thickness of the epitaxial layer 12 is formed in the absence of any intentionally added impurity. Thus, initially, the surface adjoining portion of the epitaxial layer 12 is substantially undoped.

Figure 2:
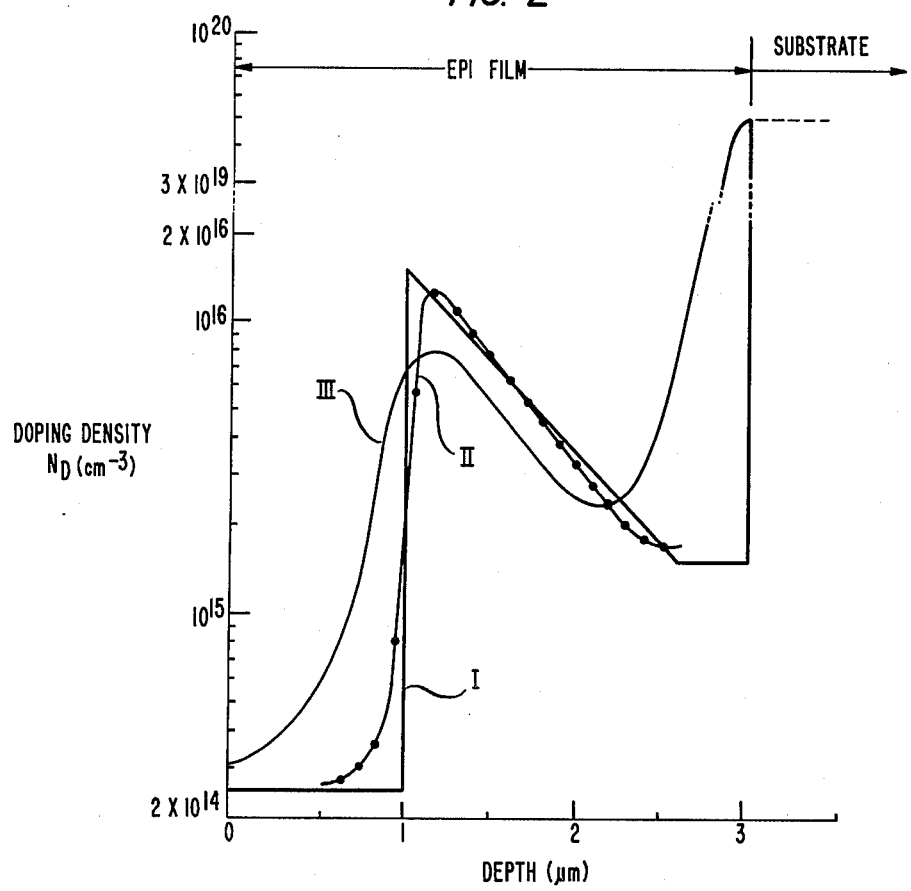

In the graph of FIG. 2 in which the impurity concentration, denoted doping density, is plotted against the depth of the epitaxial layer in microns, the outline indicated by curve I suggests an ideal profile of the N-type impurity for a hyperabrupt PNN+ diode. According to this ideal profile, the impurity concentration, beginning at the surface 13 of the starting portion 11, has a thin section at a uniform level ($\sim 1.5 \times 10^{15}$), then rises relatively rapidly by approximately an order of magnitude to a peak value ($\sim 1.5 \times 10^{16}$) at about one micron from the surface of the epitaxial layer. From this peak value, the impurity concentration drops to an extremely low value for the remaining thickness of the epitaxial layer. As indicated on the graph, the total depth of the epitaxial layer is about three microns and the starting portion doping level is about $5 \times 10^{19}$. Note that the upper section of the graph has been truncated to save space.

The concentration profile actually achieved by the molecular beam epitaxy process, although different from the design ideal, still is very close thereto and extremely advantageous from a device standpoint. Curves II and III represent, as observed by different measuring techniques, an impurity concentration profile generated for a hyperabrupt diode. Curve II represents concentration values observed by means of a capacitance-voltage technique while curve III is generated from values observed by means of spreading resistance measurement. The latter technique is known to have an effect in which there is a smearing out of values. It is evident however, from both curves that the peak occurs at or near the one micron depth and that the hyperabrupt profile ranges for somewhat beyond an additional one micron of depth over which there is a substantially uniform, rapid decrease in concentration with distance away from the PN junction located near the peak.

Referring again to FIG. 1, P-type zone 15 defines a PN junction 20 with the N-type epitaxial layer 12 at the boundary of the layer 19 which represents the impurity concentration peak. The diode structure shown in FIG. 1 is a conventional arrangement in which the P-type zone is formed by selective introduction of an impurity such as boron through a silicon oxide mask 16 either by a fairly heavy predeposit or ion implantation followed by a relatively short diffusion heat treatment. Conventional methods then are used to form the metallic electrode 17 and external lead 18 for making low resistance contact to the P-type zone 15. Contact to the N-type conductivity portion of the diode is provided by low resistance back contact 20 to the mounting terminal 21 in conventional fashion.

The significance of the hyperabrupt diode in accordance with this invention utilizing molecular beam epitaxy is perhaps more readily observed in the graph of FIG. 3. This graph is similar to the graph of FIG. 2, however the upper portion has not been truncated in order to more clearly show the P-type impurity concentration which is not shown in the graph of FIG. 2. In FIG. 3 Curve A shows the N-type impurity concentration from the substrate as introduced during the molecular beam epitaxy process. This profile is similar, in general, to that depicted by Curve II of FIG. 2. Curve B indicates the P-type impurity concentration which is diffused from the surface as previously described. The PN junction occurs near the intersection of curves A and B near the one micron depth. Curve C indicates the impurity concentration profile achieved by the ion implantation and diffusion technique which is typically used in the prior art for making hyperabrupt diodes.

There are, in particular, two contrasting features between curves A and C. Starting at the bottom of the optional layer 12, curve A shows the N-type concentration as substantially constant for about the initial one-half micron of epitaxial layer growth. At this level, the concentration then begins to rise rapidly. This characteristic occurs largely because the molecular beam epitaxy process is done at a relatively low temperature which therefore produces substantially no outdiffusion of the N-type impurity from the starting portion into the epitaxial layer. Contrastingly however, in the case of the prior art technique depicted by curve C, the heat treatment required for the introduction from the surface of the N-type impurity produces a considerable outdiffusion from the starting portion, and therefore, to ensure that ample thickness for the generation of the hyperabrupt profile is provided, the epitaxial layer is several microns thicker and the profile shows a gradually rising value in the portion adjoining the starting portion interface. The effect of this characteristic is to form a relatively large undepleted high resistivity portion in diodes of the prior art as compared with the hyperabrupt diode in accordance with this invention. As a consequence, hyperabrupt diodes in accordance with this invention generally exhibit considerably lower rf series resistance.

It is also evident from the graph of FIG. 3 that the amount of impurity compensation is much less in the surface-adjoining portion of the epitaxial layer for the diode in accordance with this invention than for the prior art diode. This tends to raise the voltage at which breakdown occurs near the surface which is particularly significant for planar type diodes.

It is apparent from the foregoing explanation and particularly from the graph of FIG. 3 that the advantageous arrangement disclosed herein resides in the precise impurity control attainable during epitaxial deposition and the low temperature at which the process is carried out. Thus it is important to fabricate diodes in accordance with this invention by processes which minimize high temperature processing subsequent to the introduction of the hyperabrupt profile determining impurity. For example, hyperabrupt diodes of the planar type having both contacts on the upper surface of the diode need a heavily doped contact region through the epitaxial layer to the heavily doped starting portion. Making this deep collector zone requires a lengthy heat treatment which produces considerable outdiffusion from the starting portion. Accordingly, to enjoy the maximum advantage of the diode structure in accordance with this invention, either a back contact of the general type shown in the structure of FIG. 1 or a reach-through contact from the surface which does not require long term high temperature treatment is most advantageous.

It will be understood that the particular diode described herein is designed for a particular application. Diodes of the hyperabrupt type having impurity concentration profiles particularly suitable for other applications also may be designed in accordance with this invention.

We claim:

1. A method of fabricating a silicon semiconductor varactor diode of the hyperabrupt junction type in which an epitaxial layer having a PN junction therein is formed on a starting portion of high conductivity and of one conductivity type
   characterized by the steps of:
   (1) growing by molecular beam epitaxy on said starting portion a layer of one conductivity type and during said growing adding an impurity of said one conductivity type in an increasing amount so that the concentration of said impurity increases to a peak value, and
   (2) terminating the addition of said impurity to the growing process at the preselected peak value while continuing to grow said epitaxial layer thereby to form a surface-adjoining layer.

2. The method in accordance with claim 1 in which an opposite type impurity is introduced into the surface-adjoining layer thereby to form a PN junction.

3. The method in accordance with claim 1 in which the impurity of said one conductivity type is antimony or arsenic.

4. The method in accordance with claim 1 in which said epitaxial growth occurs at temperatures in the range of from about 450° C. to about 950° C.

* * * * *